United States Patent
Hsieh et al.

(10) Patent No.: US 12,317,447 B2
(45) Date of Patent: May 27, 2025

(54) ADJUSTABLE HEAT SOURCE SIMULATION ASSEMBLY, CHASSIS HEAT DISSIPATION DETECTION DEVICE AND CABINET HEAT DISSIPATION DETECTION DEVICE

(71) Applicants: INVENTEC (PUDONG) TECHNOLOGY CORPORATION, Shanghai (CN); INVENTEC CORPORATION, Taipei (TW)

(72) Inventors: Han-Chih Hsieh, Taipei (TW); Pai-Yi Huang, Taipei (TW)

(73) Assignees: INVENTEC (PUDONG) TECHNOLOGY CORPORATION, Shanghai (CN); INVENTEC TECHNOLOGY CORPORATION, Taipei (TW)

( * ) Notice: Subject to any disclaimer, the term of this patent is extended or adjusted under 35 U.S.C. 154(b) by 200 days.

(21) Appl. No.: 18/209,393

(22) Filed: Jun. 13, 2023

(65) Prior Publication Data

US 2024/0314970 A1  Sep. 19, 2024

(51) Int. Cl.
*H05K 7/20* (2006.01)

(52) U.S. Cl.
CPC ..... *H05K 7/20209* (2013.01); *H05K 7/20436* (2013.01); *H05K 7/20727* (2013.01); *H05K 7/20772* (2013.01); *H05K 7/20836* (2013.01)

(58) Field of Classification Search
CPC ........ G06F 1/20; G06F 1/181; G06F 11/2273; G06F 11/2205; F28F 2200/00; G01M 99/002; H05K 7/20209; H05K 7/20136; H05K 7/20909; H05K 7/20436; H05K 7/20836; H05K 7/20772; H05K 7/20727
USPC .......................................... 361/690
See application file for complete search history.

(56) References Cited

U.S. PATENT DOCUMENTS

| | | | |
|---|---|---|---|
| 2016/0007501 A1* | 1/2016 | Nakanishi | H05K 7/20809 165/103 |
| 2018/0156552 A1* | 6/2018 | Tu | G01M 99/002 |
| 2019/0182984 A1* | 6/2019 | Chen | F28F 21/082 |
| 2022/0132704 A1* | 4/2022 | Enright | H05K 7/20809 |

FOREIGN PATENT DOCUMENTS

| | | | | |
|---|---|---|---|---|
| CN | 215930969 U | * | 3/2022 | |
| CN | 116068015 A | * | 5/2023 | G01K 1/143 |

OTHER PUBLICATIONS

English translation of CN 215930696 U (Year: 2022).*
CN215930969U English Translation (Year: 2022).*

* cited by examiner

*Primary Examiner* — Mandeep S Buttar
(74) *Attorney, Agent, or Firm* — Maschoff Brennan

(57) ABSTRACT

This disclosure relates to an adjustable heat source simulation assembly includes at least one first simulation heater, a second simulation heater and a power output module. The at least one first simulation heater and the second simulation heater are configured to be disposed in a server chassis. The power output module is electrically connected to the at least one first simulation heater and the second simulation heater so as to control heating power of the at least one first simulation heater and the second simulation heater.

8 Claims, 6 Drawing Sheets

ADJUSTABLE HEAT SOURCE SIMULATION ASSEMBLY, CHASSIS HEAT DISSIPATION DETECTION DEVICE AND CABINET HEAT DISSIPATION DETECTION DEVICE

CROSS-REFERENCE TO RELATED APPLICATIONS

This non-provisional application claims priority under 35 U.S.C. § 119(a) on Patent Application No(s). 202310252246.7 filed in China, P.R.C. on Mar. 14, 2023, the entire contents of which are hereby incorporated by reference.

BACKGROUND OF THE INVENTION

Technical Field of the Invention

The present disclosure relates to an adjustable heat source simulation assembly, a chassis heat dissipation detection device and a cabinet heat dissipation detection device, more particularly to an adjustable heat source simulation assembly applicable to a chassis heat dissipation detection device and a cabinet heat dissipation detection device.

Description of the Related Art

As the performance of electric components such as processers in a server has been improved, more heat with higher temperature is generated in the server. Therefore, a proper configuration inside the server needs to be designed in the development stage so as to meet the heat dissipation requirements of the server.

However, the components in the server are large amount and expensive. It will be time-wasting and cost-wasting if waiting every component is developed and using every developed component in the heat dissipation test. Therefore, how to quickly and cheaply accomplish the heat dissipation test inside the server has become a topic issue in the related field.

SUMMARY OF THE INVENTION

The present disclosure provides an adjustable heat source simulation assembly, a chassis heat dissipation detection device and a cabinet heat dissipation detection device capable of quickly and cheaply accomplishing a heat dissipation test inside a server.

According to one aspect of the present disclosure, an adjustable heat source simulation assembly includes at least one first simulation heater, a second simulation heater, and a power output module. The at least one first simulation heater is configured to be disposed in a server chassis and configured to receive an airflow provided by an air-cooling module. The second simulation heater is configured to be disposed in the server chassis and configured to receive the airflow provided by the air-cooling module. The power output module is electrically connected to the at least one first simulation heater and the second simulation heater so as to control heating power of the at least one first simulation heater and the second simulation heater.

According to another aspect of the present disclosure, a chassis heat dissipation detection device includes a server chassis, a mainboard, an adjustable heat source simulation assembly, an air-cooling module, and a liquid-cooling module. The mainboard is disposed on the server chassis. The adjustable heat source simulation assembly includes at least one first simulation heater, a second simulation heater, and a power output module. The at least one first simulation heater is disposed on the mainboard. The second simulation heater is disposed on the mainboard. The power output module is electrically connected to the at least one first simulation heater and the second simulation heater so as to control heating power of the at least one first simulation heater and the second simulation heater. The air-cooling module is disposed at a side of the at least one first simulation heater and the second simulation heater, and the air-cooling module faces the at least one first simulation heater and the second simulation heater. The liquid-cooling module is in thermal contact with the at least one first simulation heater.

According to another aspect of the present disclosure, a cabinet heat dissipation detection device includes a server cabinet, a plurality of aforementioned chassis heat dissipation detection devices disposed in the server cabinet, and a heat exchanger disposed at a side of the at least one first simulation heater and the second simulation heater away from the air-cooling module.

According to the adjustable heat source simulation assembly, the chassis heat dissipation detection device and the cabinet heat dissipation detection device discussed above, the at least one first simulation heater and the second simulation heater can be used as simulators of a CPU, storage media and graphic cards of a server so as to simulate the heating situation inside the actual operating server. Further, the air-cooling module, the liquid-cooling module and the heat exchanger can be used to simulate the heat-dissipation situation of the actual operating server. Therefore, the heat dissipation requirement testing, including the determination of the heating situation and a sufficient heat-dissipation capacity of the server, can be accomplished without waiting for all components of the server to be developed, which greatly shortens the developing and time cost.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
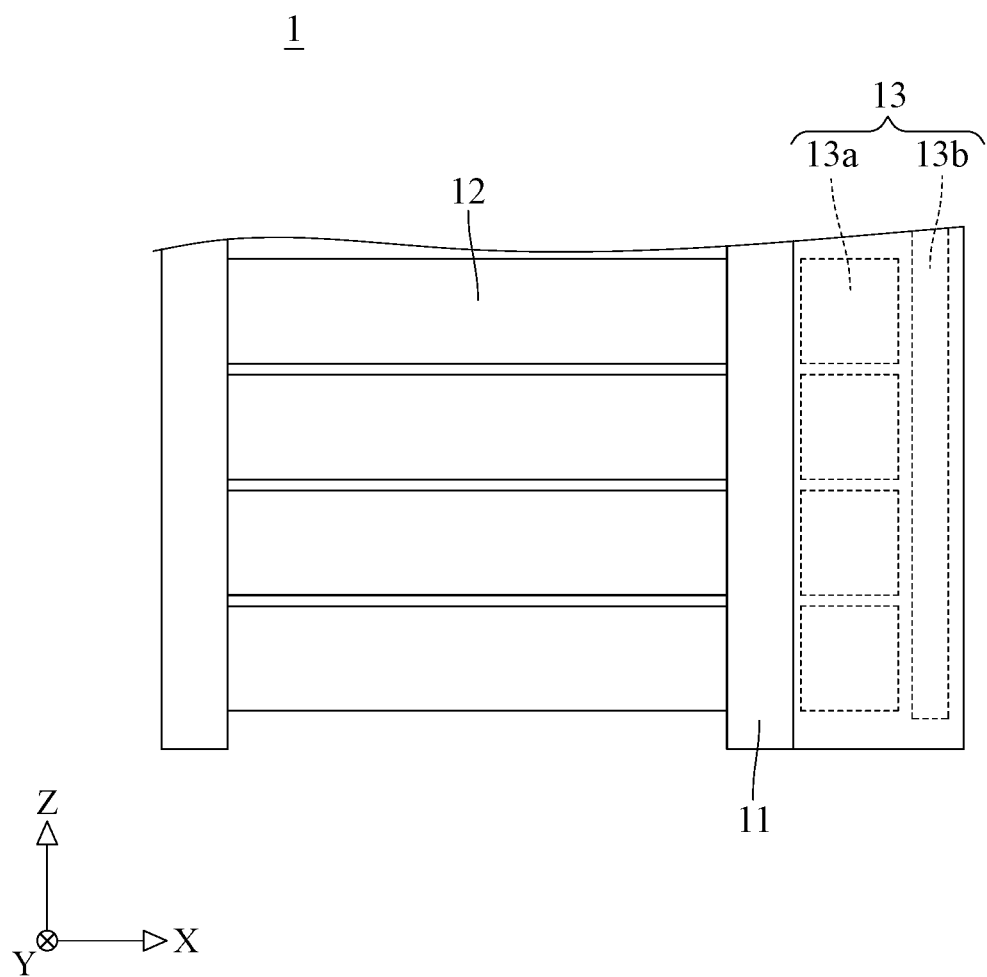
FIG. 1 is a schematic side view of a cabinet heat dissipation detection device according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One embodiment of the present disclosure will be illustrated hereinafter. Please refer to FIG. 1, which is a schematic side view of a cabinet heat dissipation detection device according to one embodiment of the present disclosure. This embodiment provides a cabinet heat dissipation detection device 1 including a server cabinet 11, a plurality of chassis heat dissipation detection devices 12 and a heat exchanger 13. The server cabinet 11 is, for example, a cabinet of a server. The quantity of the chassis heat dissipation detection devices is, for example, eighteen. These eighteen chassis heat dissipation detection devices 12 may be sequentially stacked on the server cabinet 11 along a direction Z and are configured to generate heat. The heat exchanger 13 may be disposed at a side of the chassis heat dissipation detection devices 12 along a direction X perpendicular to the direction Z. The heat exchanger 13 is, for example, a backdoor of the server and can include a plurality of fans 13a and at least one liquid-cooling pipe 13b. The liquid-cooling pipe 13b further includes a plurality of liquid-cooling branches (not shown) respectively corresponding to the chassis heat dissipation detection devices 12. The fans 13a can provide an airflow flowing along the direction X so as to bring the heat from the chassis heat dissipation detection devices 12 to the heat exchanger 13, and then the liquid in the liquid-cooling pipe 13b can absorb the heat in the heat exchanger 13 and take the heat away from the server cabinet 11.

Figure 2:
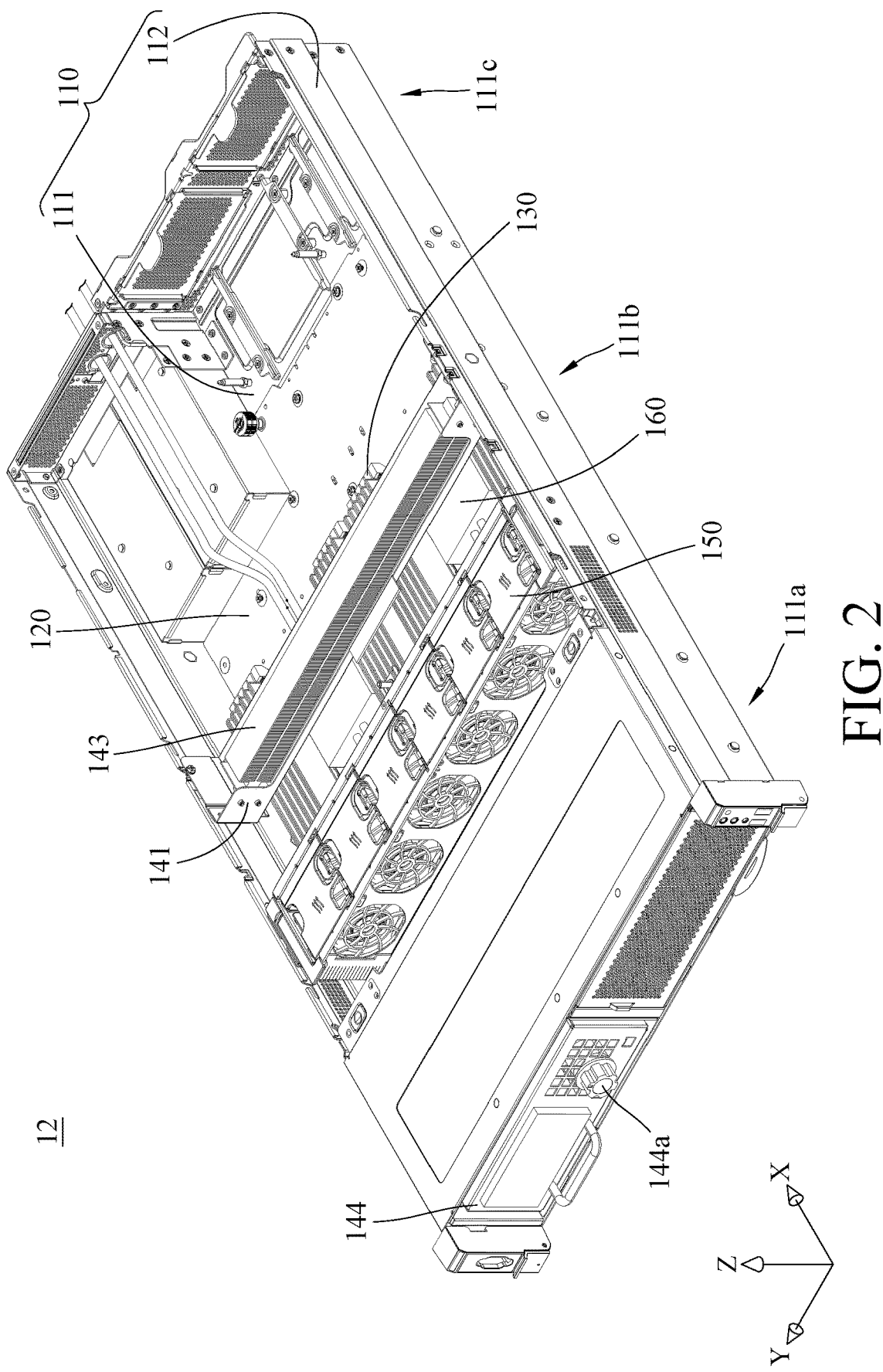
FIG. 2 is a perspective view of a chassis heat dissipation detection device of the cabinet heat dissipation detection device in FIG. 1.
Figure 3:
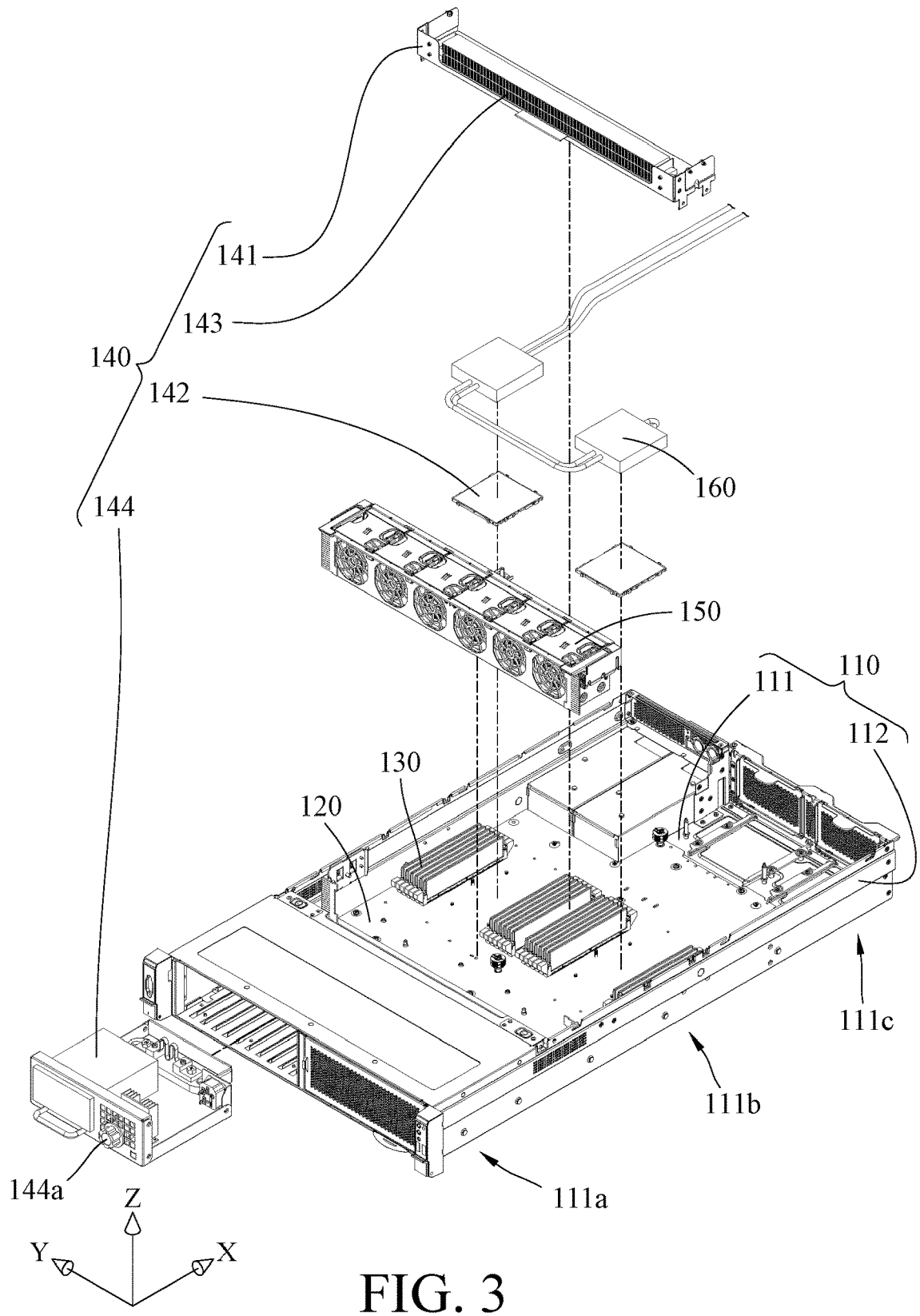
FIG. 3 is an exploded view of the chassis heat dissipation detection device in FIG. 2.
Figure 4:
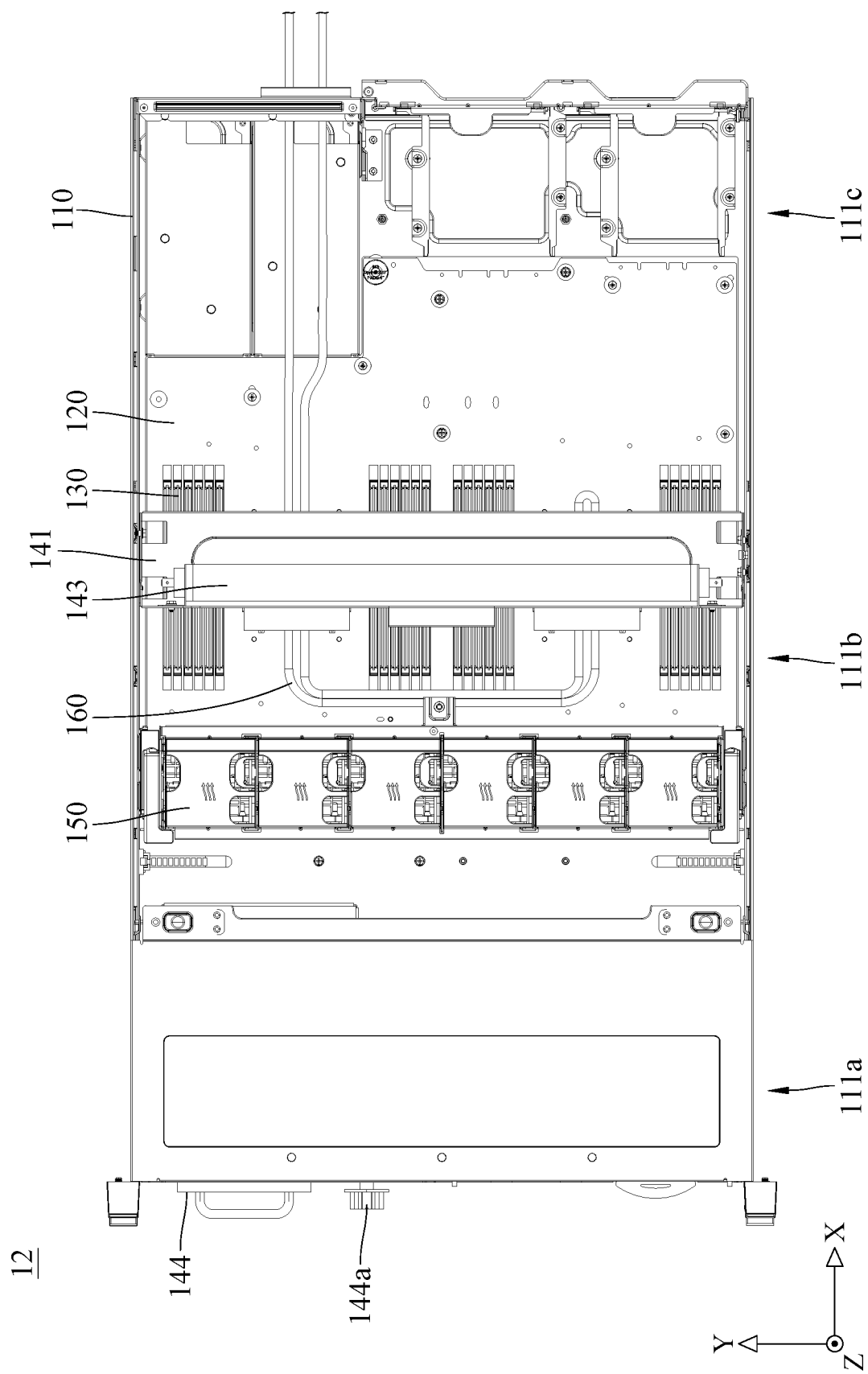
FIG. 4 is a top view of the chassis heat dissipation detection device in FIG. 2.
Figure 5:
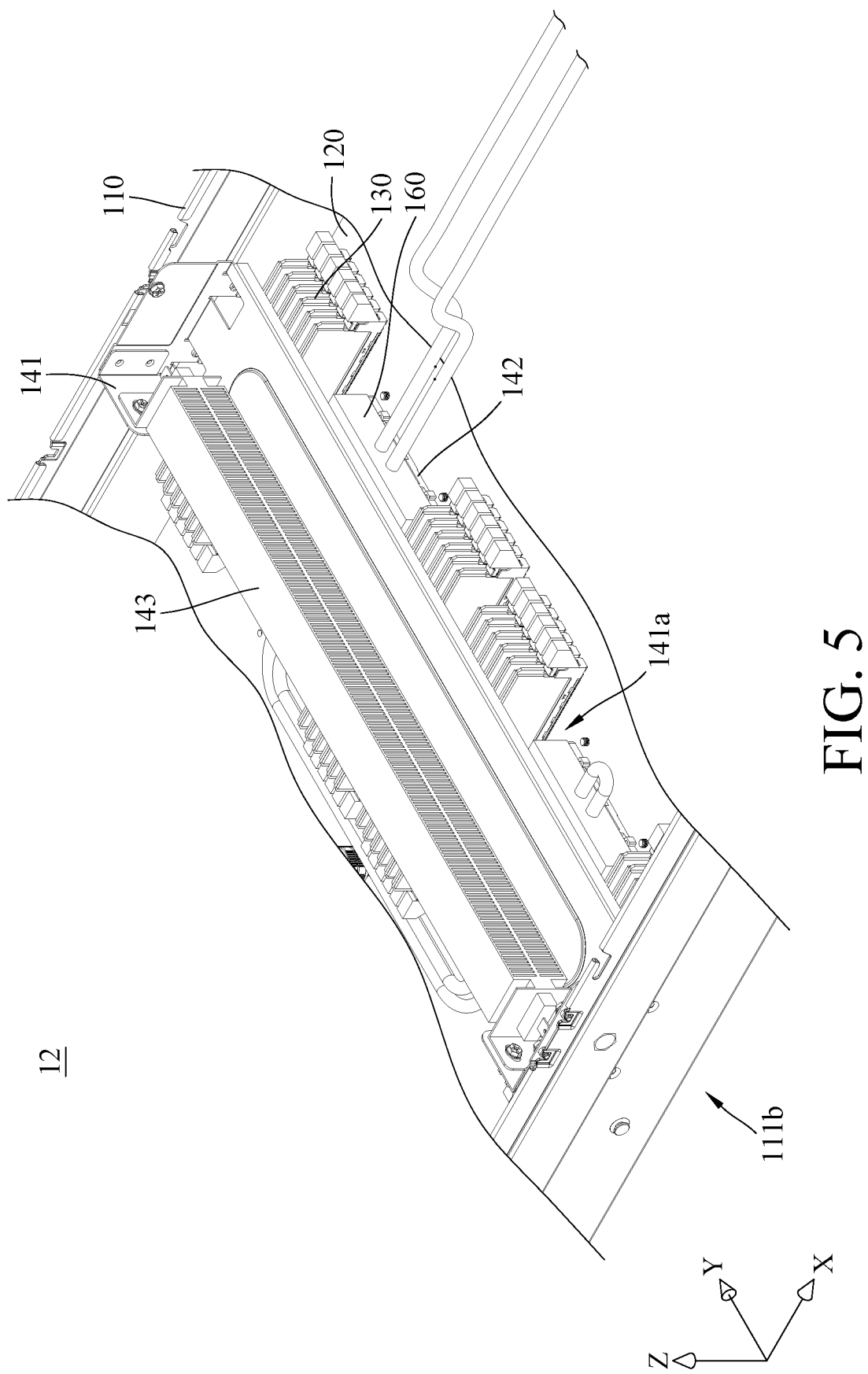
FIG. 5 is a partial and enlarged view of the chassis heat dissipation detection device in FIG. 2.

Every chassis heat dissipation detection device 12 is substantially the same in configuration, and therefore only one chassis heat dissipation detection device 12 will be illustrated hereinafter. Please refer to FIG. 2 to FIG. 5, where FIG. 2 is a perspective view of a chassis heat dissipation detection device of the cabinet heat dissipation detection device in FIG. 1, FIG. 3 is an exploded view of the chassis heat dissipation detection device in FIG. 2, FIG. 4 is a top view of the chassis heat dissipation detection device in FIG. 2, and FIG. 5 is a partial and enlarged view of the chassis heat dissipation detection device in FIG. 2. The chassis heat dissipation detection device 12 can include a server chassis 110, a mainboard 120, a plurality of memories 130, an adjustable heat source simulation assembly 140, an air-cooling module 150 and a liquid-cooling module 160.

The server chassis 110 can include a bottom plate 111 and two lateral plates 112. A normal direction of the bottom plate 111 is the same as the direction Z. The bottom plate 111 can include a front area 111a, a middle area 111b and a rear area 111c. The middle area 111b is located between the front area 111a and the rear area 111c along the direction X. The lateral plates 112 are opposite to each other along a direction Y perpendicular to the direction X and the direction Z, and the lateral plates 112 stand on the bottom plate 111 and extend along the direction X. The mainboard 120 can be disposed on the bottom plate 111 of the server chassis 110. The memories 130 can be disposed on the mainboard 120.

The adjustable heat source simulation assembly 140 can include a bracket 141, two first simulation heaters 142, a second simulation heater 143 and a power output module 144. The bracket 141 can be disposed on the mainboard 120 and can include an opening 141a at a side thereof close to the mainboard 120, as shown in FIG. 5.

The first simulation heaters 142 can be disposed on the mainboard 120 and can be located at the opening 141a of the bracket 141 in the middle area 111b of the bottom plate 111 so as to correspond to the disposing position of the central processing unit (CPU) of the server. The first simulation heaters 142 can be heating copper plates. Each first simulation heater 142 can provide heating power of approximate 400 watts so as to be used as a simulation heater of the CPU of the server.

The second simulation heater 143 can be disposed on the bracket 141 so as to indirectly disposed on the mainboard 120 and can be located in the middle area 111b of the bottom plate 111 so as to correspond to the position where heat is most likely to accumulate in the server. The second simulation heater 143 can have a projection on the bottom plate 111 overlapped with projections of the first simulation heaters 142 on the bottom plate 111, and the second simulation heater 143 can be supported by the bracket 141 to be spaced apart from the first simulation heaters 142 along the direction Z. The second simulation heater 143 can be a heating pipe including a plurality of heating fins. The second simulation heater 143 can provide heating power of approximate 1100 to 1200 watts so as to be used as a simulation heater of the storage media and interface cards of a server, such as hard disks, graphic cards and network cards of the server. In addition, the heat generated by the second simulation heater 143 can be 5% to 10% higher than the heat generated by the storage media and the interface cards in actual operation, which can provide a strict heating environment for heat dissipation simulation.

The power output module 144 can be located in the front area 111a so as to correspond to the disposing position of the hard disks of the server, and the power output module 144 can also be used in an arrangement simulation to partially block the airflow flowing into the chassis heat dissipation detection device 12. The power output module 144 is electrically connected to the first simulation heaters 142 and the second simulation heater 143. The power output module 144 can include a knob 144a. The power output module 144 can adjust outputting power to the first simulation heaters 142 and the second simulation heater 143 according to rotation angle of the knob 144a so as to control heating power of the first simulation heaters 142 and the second simulation heater 143, thereby simulating the heating situation inside the chassis of the operating server. For example, the power output module in one case can adjust heating power of the first simulation heaters and the second simulation heater according to test requirements so as to determine whether the cooling ability inside the chassis of the server is sufficient. Therefore, the heat dissipation requirement testing can be accomplished in the initial stage of server development without waiting for all components of the server to be developed, which greatly shortens the developing and testing time.

The air-cooling module 150 is, for example, a fan module. The air-cooling module 150 can be disposed at a side of the first simulation heaters 142 and the second simulation heater 143 away from the heat exchanger 13 (labeled in FIG. 1). It can be also considered that the air-cooling module 150 can be located closer to the front area 111a than the first simulation heaters 142 and the second simulation heater 143. The air-cooling module 150 faces the first simulation heaters 142 and the second simulation heater 143 so as to provide airflow for the first simulation heaters 142 and the second simulation heater 143. As such, heat generated by the first simulation heaters 142 and the second simulation heater 143 can be taken to the heat exchanger 13 along the direction X, which can simulate the flowing situation inside the operating server. Moreover, the airflow provided by the air-cooling module 150 can be divided into two smaller airflows at the bracket 141, which can further simulate the flowing situation inside the server with components distributed therein.

The liquid-cooling module 160 is, for example, liquid-cooling pipes. The liquid-cooling module 160 can be disposed through the opening 141a of the bracket 141 and in thermal contact with the first simulation heaters 142, and the liquid-cooling module 160 can be in communication connection with the liquid-cooling branches (not shown) outside the server chassis 110, such that heat generated by the first simulation heaters 142 can be taken away from the server chassis 110 so as to simulate heat dissipation to the CPU of high heating power by using liquid with high heat-absorbing efficiency. Further, the liquid-cooling branches connected to the plurality of server chassis converge to the liquid-cooling pipe 13b that can quickly take heat away from the server chassis by an open circulation system.

According to the cabinet heat dissipation detection device 1 discussed above, the first simulation heaters 142 and the second simulation heater 143 can be used as simulators of the CPU, the storage media and the graphic cards of the server so as to simulate the heating situation inside the actual operating server. Further, the air-cooling module 150, the liquid-cooling module 160 and the heat exchanger 13 can be used to simulate the heat-dissipation situation of the actual operating server. Specifically, the heat generated by the first simulation heaters 142 can be taken away by the liquid-cooling module 160, the liquid-cooling branches and the liquid-cooling pipe 13b, which is considered as the heat-dissipation simulation of the CPU; the heat generated by the second simulation heater 143 can be taken away by the air-cooling module 150, the fans 13a and the liquid-cooling pipe 13b, which is considered as the heat-dissipation simulation of the storage media and the graphic cards. Therefore, the heat dissipation requirement testing, including the determination of the heating situation and a sufficient heat-dissipation capacity of the server, can be accomplished without waiting for all components of the server to be developed, which greatly shortens the developing and time cost.

Figure 6:
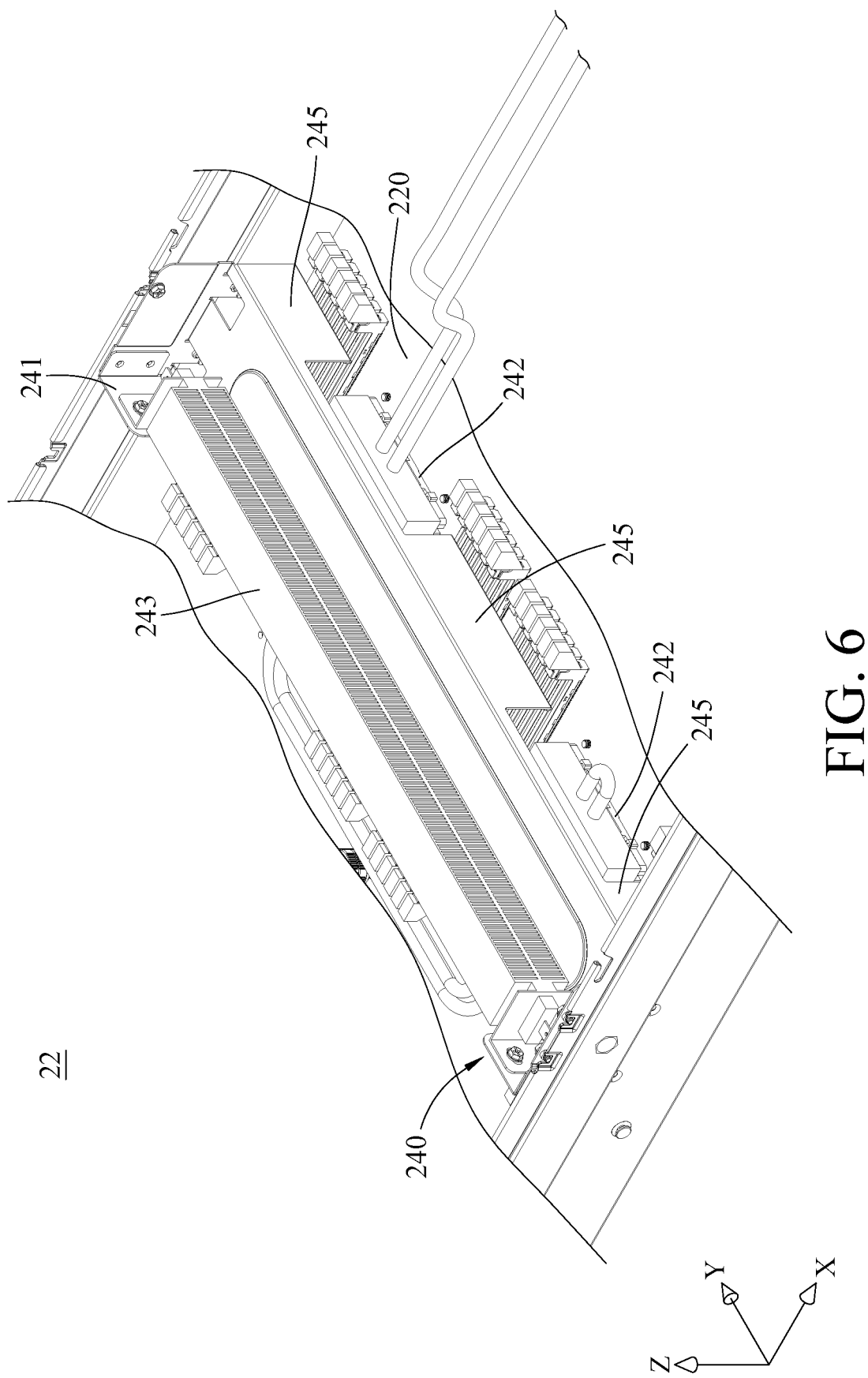
FIG. 6 is a partial and enlarged view of a chassis heat dissipation detection device according to one embodiment of the present disclosure.

Please refer to FIG. 6, which is a partial and enlarged view of a chassis heat dissipation detection device according to one embodiment of the present disclosure. This embodiment provides a chassis heat dissipation detection device 22, which is similar to the chassis heat dissipation detection device 12 of the abovementioned embodiment. Therefore, only difference between the chassis heat dissipation detection device 22 and the chassis heat dissipation detection device 12 will be illustrated hereinafter.

In the chassis heat dissipation detection device 22, the adjustable heat source simulation assembly 240 can further include three guide plates 245 that can be connected to the bracket 241. The guide plates 245 can be located between the second simulation heater 243 and the mainboard 220. Moreover, each first simulation heater 242 can be located between adjacent two guide plates 245. In some cases, new-type memory samples may not be available for the heat-dissipation requirement testing in the initial stage of server development. The guide plates 245 can be used as simulators of memories to simulate the configuration where an airflow flows to the memories, which can further close to the actual flowing situation inside the actual operating server. Moreover, the heating power of the second simulation heater 243 can be increased so as to further use the second simulation heater 243 as simulators of the memories.

According to the adjustable heat source simulation assembly, the chassis heat dissipation detection device and the cabinet heat dissipation detection device discussed above, the first simulation heaters and the second simulation heater can be used as simulators of the CPU, the storage media and the graphic cards of the server so as to simulate the heating situation inside the actual operating server. Further, the air-cooling module, the liquid-cooling module and the heat exchanger can be used to simulate the heat-dissipation situation of the actual operating server. Therefore, the heat dissipation requirement testing, including the determination of the heating situation and a sufficient heat-dissipation capacity of the server, can be accomplished without waiting for all components of the server to be developed, which greatly shortens the developing and time cost.

Please be noted that in one embodiment of the present disclosure, the server of the present disclosure can be used for artificial intelligence (AI) computing, edge computing, and can also be served as a 5G server, cloud server or a vehicle network server.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. An adjustable heat source simulation assembly, comprising: at least one first simulation heater, configured to be disposed in a server chassis and configured to receive an airflow provided by an air-cooling module; a second simulation heater, configured to be disposed in the server chassis and configured to receive the airflow provided by the air-cooling module; and a power output module, electrically connected to the at least one first simulation heater and the second simulation heater so as to control heating power of the at least one first simulation heater and the second simulation heater; further comprising a bracket supporting the second simulation heater so as to space the at least one first simulation heater apart from the second simulation heater in a normal direction of a bottom plate of the server chassis, wherein a projection of the second simulation heater on the bottom plate is overlapped with a projection of the at least one first simulation heater on the bottom plate.

2. The adjustable heat source simulation assembly according to claim 1, further comprising at least one guide plate connected to the bracket, wherein the at least one guide plate is located between the second simulation heater and the bottom plate of the server chassis, and the at least one guide plate is located a side of the at least one first simulation heater.

3. The adjustable heat source simulation assembly according to claim 1, wherein the power output module comprises a knob, and the power output module adjusts outputting power to the at least one first simulation heater and the second simulation heater according to rotation angle of the knob.

4. The adjustable heat source simulation assembly according to claim 1, wherein the at least one first simulation heater is at least one heating copper plate, and the second simulation heater is at least one heating pipe.

5. A chassis heat dissipation detection device, comprising: a server chassis; a mainboard, disposed on the server chassis; an adjustable heat source simulation assembly, comprising: at least one first simulation heater, disposed on the mainboard; a second simulation heater, disposed on the mainboard; and a power output module, electrically connected to the at least one first simulation heater and the second simulation heater so as to control heating power of the at least one first simulation heater and the second simulation heater; an air-cooling module, disposed at a side of the at least one first simulation heater and the second simulation heater, wherein the air-cooling module faces the at least one first simulation heater and the second simulation heater; and a liquid-cooling module, in thermal contact with the at least one first simulation heater; wherein the adjustable heat source simulation assembly further comprises a bracket supporting the second simulation heater so as to space the at least one first simulation heater apart from the second simulation heater in a normal direction of a bottom plate of the server chassis, and a projection of the second simulation heater on the bottom plate is overlapped with a projection of the at least one first simulation heater on the bottom plate.

6. The chassis heat dissipation detection device according to claim 5, wherein the server chassis comprises a bottom plate and at least one lateral plate standing on the bottom plate, the bottom plate comprises a front area, a middle area and a rear area, the middle area is located between the front area and the rear area in an extension direction of the at least one lateral plate, the at least one first simulation heater and the second simulation heater are located in the middle area, the power output module is located in the front area, and the air-cooling module is located closer to the front area than the at least one first simulation heater and the second simulation heater.

7. The chassis heat dissipation detection device according to claim 5, wherein the adjustable heat source simulation assembly further comprises at least one guide plate connected to the bracket, the at least one guide plate is located between the second simulation heater and the bottom plate of the server chassis, and the at least one guide plate is not overlapped with the at least one first simulation heater in a facing direction of the air-cooling module.

8. A cabinet heat dissipation detection device, comprising:
a server cabinet;
a plurality of chassis heat dissipation detection devices of claim 5, disposed in the server cabinet; and
a heat exchanger, disposed at a side of the at least one first simulation heater and the second simulation heater away from the air-cooling module.

* * * * *

UNITED STATES PATENT AND TRADEMARK OFFICE
CERTIFICATE OF CORRECTION

| | | |
|---|---|---|
| PATENT NO. | : 12,317,447 B2 | Page 1 of 1 |
| APPLICATION NO. | : 18/209393 | |
| DATED | : May 27, 2025 | |
| INVENTOR(S) | : Han-Chih Hsieh and Pai-Yi Huang | |

It is certified that error appears in the above-identified patent and that said Letters Patent is hereby corrected as shown below:

On the Title Page

In item (73), under "Assignee:" delete "INVENTEC TECHNOLOGY CORPORATION, Taipei (TW)"
And insert:
--INVENTEC CORPORATION, Taipei (TW)--

Column 1, insert Item (30):
--Foreign Application Priority Data:
Mar. 14, 2023 (CN) ..........................202310252246.7--

Signed and Sealed this
First Day of July, 2025

Coke Morgan Stewart
*Acting Director of the United States Patent and Trademark Office*